(12) United States Patent
Lee et al.

(10) Patent No.: US 7,745,255 B2
(45) Date of Patent: Jun. 29, 2010

(54) BONDING PAD STRUCTURE, ELECTRONIC DEVICE HAVING A BONDING PAD STRUCTURE AND METHODS OF FABRICATING THE SAME

(75) Inventors: Jae-Hyun Lee, Suwon-si (KR); Hyung-Moo Park, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 22 days.

(21) Appl. No.: 12/010,807

(22) Filed: Jan. 30, 2008

(65) Prior Publication Data

US 2008/0197511 A1 Aug. 21, 2008

(30) Foreign Application Priority Data

Feb. 16, 2007 (KR) .................... 10-2007-0016525

(51) Int. Cl.
H01L 21/44 (2006.01)
(52) U.S. Cl. ................ 438/106; 438/612; 257/E21.499
(58) Field of Classification Search ................ 438/411, 438/416, 611, 613, 734, 751, 107–108, 111, 438/109–110, 106, 612, 617; 257/E23.012, 257/778, E21.499
See application file for complete search history.

(56) References Cited

U.S. PATENT DOCUMENTS

| 6,794,752 | B2 | 9/2004 | Lee et al. | |
|---|---|---|---|---|
| 7,372,082 | B2 * | 5/2008 | Kim et al. | ..................... 257/99 |
| 7,495,319 | B2 * | 2/2009 | Fukuda et al. | ............. 438/108 |
| 2002/0155672 | A1 | 10/2002 | Wang et al. | |
| 2006/0166402 | A1 | 7/2006 | Lim et al. | |

FOREIGN PATENT DOCUMENTS

| JP | 10-163635 | 6/1998 |
|---|---|---|
| JP | 2001-326241 | 11/2001 |
| KR | 10-1997-0052402 | 7/1997 |

* cited by examiner

*Primary Examiner*—Hoa B Trinh
(74) *Attorney, Agent, or Firm*—Harness, Dickey & Pierce, P.L.C.

(57) ABSTRACT

An electronic device having a bonding pad structure and a method of fabricating the same is provided. The electronic device may include a first bonding pads formed on the substrate. A second bonding pad may be formed on the lower insulating layer. The second bonding pads may be spaced apart from the first bonding pads. The second bonding pads may have a top surface formed at a higher level than the first bonding pads.

10 Claims, 6 Drawing Sheets

BONDING PAD STRUCTURE, ELECTRONIC DEVICE HAVING A BONDING PAD STRUCTURE AND METHODS OF FABRICATING THE SAME

PRIORITY STATEMENT

The present application claims the benefit of priority under 35 U.S.C. §119 from Korean Patent Application No. 10-2007-0016525, filed on Feb. 16, 2007, the disclosure of which is hereby incorporated herein by reference in its entirety.

BACKGROUND

1. Technical Field

Example embodiments relate to a bonding pad structure and a method of fabricating the same. Other example embodiments relate to an electronic device having a bonding pad structure and a method of fabricating the same.

2. Discussion of the Related Art

In recent years, electronic products and communication devices have been scaled-down and/or manufactured to operate with a higher performance. Due to this trend, researchers are looking for various ways to develop higher-performing electronic devices (e.g., a semiconductor chip including the electronic products and the communication devices) and/or decrease the size of the electronic products and the communication devices. In order to decrease the size of the electronic devices (e.g., the semiconductor chip), semiconductor manufacturing techniques have been developed with regard to fine line widths, multi-layered metal interconnection lines and the like.

Semiconductor manufacturing techniques, which use multi-layered metal interconnection lines, have been widely researched and used. The multi-layered metal interconnection lines may be formed of copper (Cu) interconnects having a damascene interconnect structure with low resistivity and/or high reliability in order to increase the performance of the semiconductor chip.

There are limits to decreasing the size of the electronic device using the conventional semiconductor manufacturing techniques for forming fine line widths and the multi-layered metal interconnection lines. In order to decrease the size of the electronic device, the bonding pad pitch may be reduced. The bonding pad may contact a bonding wire that electrically connects the semiconductor chip and a printed circuit board.

A bonding pad structure of the semiconductor device using Cu interconnects has been acknowledged in the art. A bonding pad structure formed of an aluminum layer may be formed on a substrate having the Cu interconnects. According to the conventional art, the Cu interconnects may be used to increase the performance of the electronic device. A plurality of bonding pad structures may be formed at a same level. Because there are limits to reducing the distance between the bonding pads positioned at a same level, there are also limits to reducing the bonding pad pitch. As such, it may be difficult to decrease the two-dimensional area occupied by the bonding pads in the semiconductor chip.

SUMMARY

Example embodiments relate to a bonding pad structure and a method of fabricating the same. Other example embodiments relate to an electronic device having a bonding pad structure and a method of fabricating the same.

Example embodiments are directed a bonding pad structure which is capable of decreasing (or reducing) a bonding pad pitch.

In accordance with example embodiments, a bonding pad structure may include a first bonding pad formed on a substrate. A second bonding pad, which is spaced apart from the first bonding pad, may be formed having a top surface positioned at a higher level than the first bonding pad.

The second bonding pad may have a first region positioned at the same level as the first bonding pad and a second region positioned (or formed) at a higher level than the first bonding pad. The second region may have a greater width than that of the first region. The first bonding pad and the second bonding pad may have bottom surfaces which are positioned at a same level.

The bonding pad structure may include an insulating layer, which is interposed between the first bonding pad and the second bonding pad. The insulating layer may have a top surface, which is positioned (or formed) at a higher level than the first bonding pad. The second bonding pad may be formed on (or over) a portion of a top surface of the insulating layer.

The bonding pad structure may include an insulating spacer provided on a side wall of the second bonding pad. The insulating spacer may be formed on (or covering) the side wall of the second bonding pad and a portion of the first bonding pad.

In example embodiments, an electronic device having a bonding pad structure is provided. The electronic device includes a lower insulating layer provided on a substrate. First bonding pads, which pass through (or are formed between) the lower insulating layer, are provided. An upper insulating layer may be provided on the lower insulating layer around the first bonding pads. Second bonding pads may sequentially pass through (or be formed between) the upper insulating layer and the lower insulating layer, respectively. The second bonding pads may be spaced apart from the first bonding pads. The second bonding pads may have a top surface positioned at a higher level than the first bonding pads.

The electronic device may include an interlayer insulating layer and/or metal patterns. The interlayer insulating layer may be interposed between the substrate and the lower insulating layer. The metal patterns may pass through (or be formed between) the interlayer insulating layer. The metal patterns may be electrically connected to the first bonding pads and the second bonding pads. Each of the first bonding pads may be formed on (or covering) a portion of a top surface of the lower insulating layer.

The upper insulating layer may be formed on (or covering) a portion of top surfaces of the first bonding pads. The second bonding pads may be formed on (or covering) a portion of a top surface of the upper insulating layer.

The electronic device may include insulating spacers on side walls of the second bonding pads. The insulating spacer may be formed on (or covering) the side walls of the second bonding pads and a portion of the first bonding pads.

According to example embodiments, a method of fabricating a bonding pad structure includes forming a first bonding pad on a substrate, forming a second bonding pad spaced apart from the first bonding pad, wherein a top surface of the second bonding pad is formed at a higher level than the first bonding pad.

According to other example embodiments, a method of fabricating an electronic device having a bonding pad structure is provided. The method includes forming a lower insulating layer on the substrate. First bonding pads may be formed passing through (or between) the lower insulating layer. An upper insulating layer may be formed on the substrate having the first bonding pads. Second bonding pads may be formed sequentially passing through (or between) the upper insulating layer and the lower insulating layer, respectively. The second bonding pads may be spaced apart from the first bonding pads. The second bonding pads may have a top surface positioned at a higher level than the first bonding pads. The upper insulating layer may be etched using the second bonding pads as etching masks so as to expose top surfaces of the first bonding pads.

The method may include forming an interlayer insulating layer on the substrate and forming metal patterns in the interlayer insulating layer, before forming the lower insulating layer. The metal patterns may be electrically connected to the first bonding pads and the second bonding pads.

The first bonding pads may be formed on (or covering) a portion of a top surface of the lower insulating layer. The second bonding pads may be formed on (or covering) a portion of a top surface of the upper insulating layer. The forming of the first bonding pads may include pattering the lower insulating layer to form first pad holes, which pass through the lower insulating layer; forming a first pad layer on the substrate having the first pad holes and patterning the first pad layer.

The method may include forming the first pad layer, forming a first buffer layer on the first pad and patterning the first buffer layer to form first buffer patterns on the first bonding pads. Forming and patterning the first buffer layer may be performed while patterning the first pad layer. The upper insulating layer may be etched using the second bonding pads as an etching mask. The first buffer patterns may be removed.

The forming of the second bonding pads may include patterning the upper insulating layer and the lower insulating layer to form second pad holes, which pass through the upper insulating layer and the lower insulating layer, respectively, forming a second pad layer on the substrate having the second pad holes and patterning the second pad layer.

The method may include forming the second pad layer, forming a second buffer layer on the second pad layer and patterning the second buffer layer to form second buffer patterns on the second bonding pads. Forming and patterning the second buffer layer may be performed while patterning the second pad layer. The upper insulating layer may be etched. The second buffer patterns may be removed.

The method may include forming a spacer insulating layer on the substrate having the second bonding pads. Top surfaces of the first bonding pads may be exposed. The spacer insulating layer may be anisotropically etched to form insulating spacers on side walls of the second bonding pads. The insulating spacers may be formed on (or covering) the side wall of the second bonding pads and a portion of the first bonding pads.

The method may include forming insulating spacers on the side walls of the second bonding pads, after forming the second bonding pads.

BRIEF DESCRIPTION OF THE DRAWINGS

Example embodiments will be more clearly understood from the following detailed description taken in conjunction with the accompanying drawings. FIGS. 1A-1E and 2 represent non-limiting, example embodiments as described herein.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a bonding pad structure and a method of fabricating the same. Other example embodiments relate to an electronic device having a bonding pad structure and a method of fabricating the same.

Figure 1A:
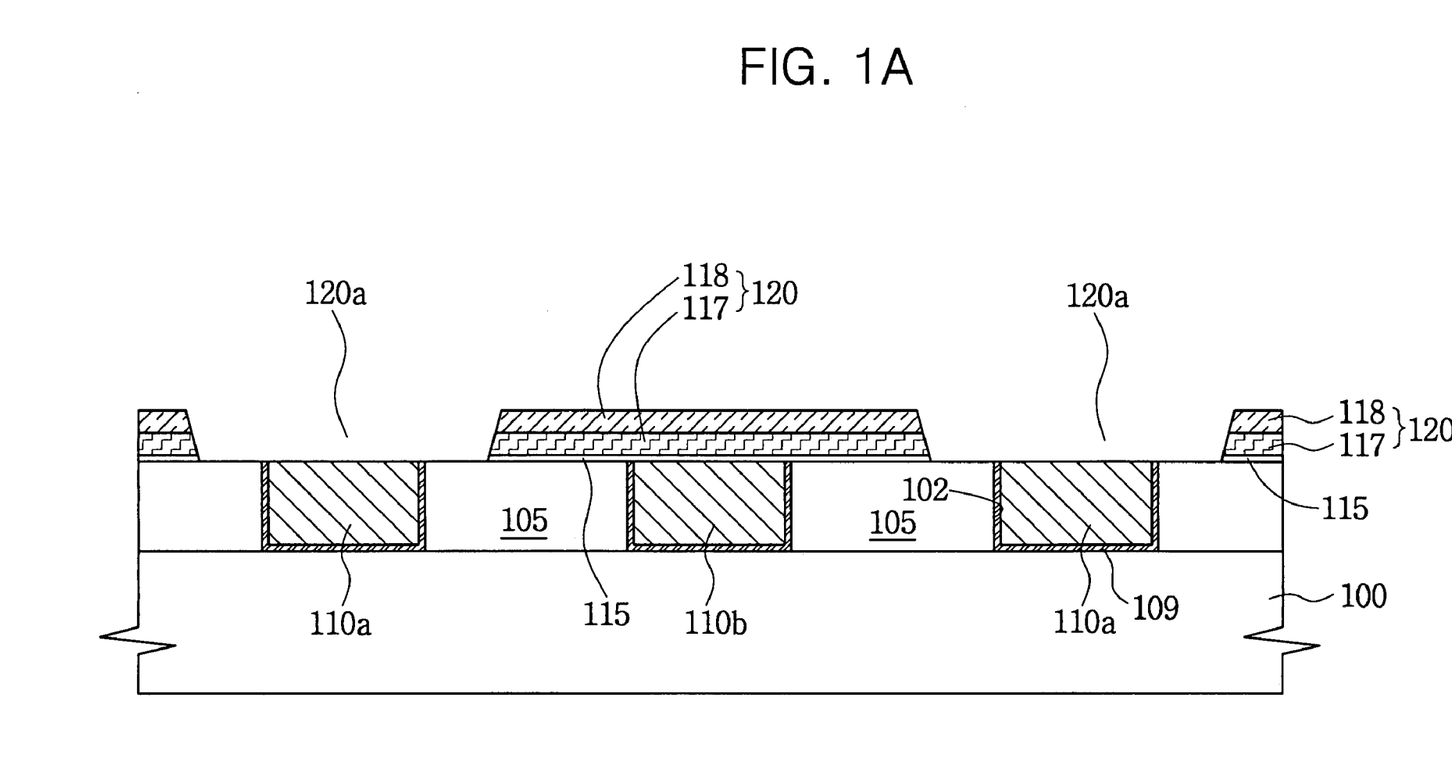
FIG. 1A through FIG. 1E are diagrams illustrating cross-sectional views of a method of fabricating an electronic device according to example embodiments.
Figure 1B:
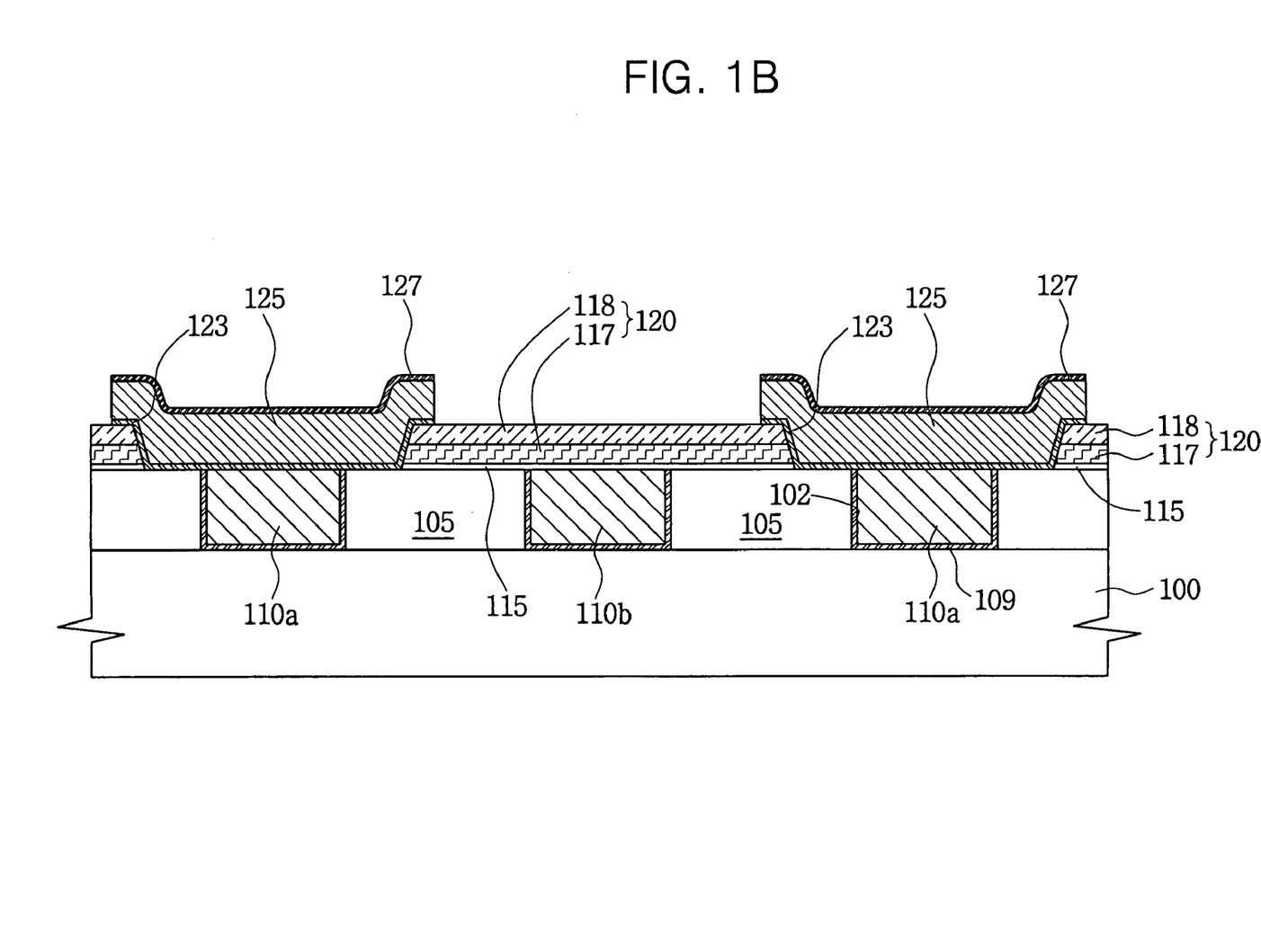
Figure 1C:
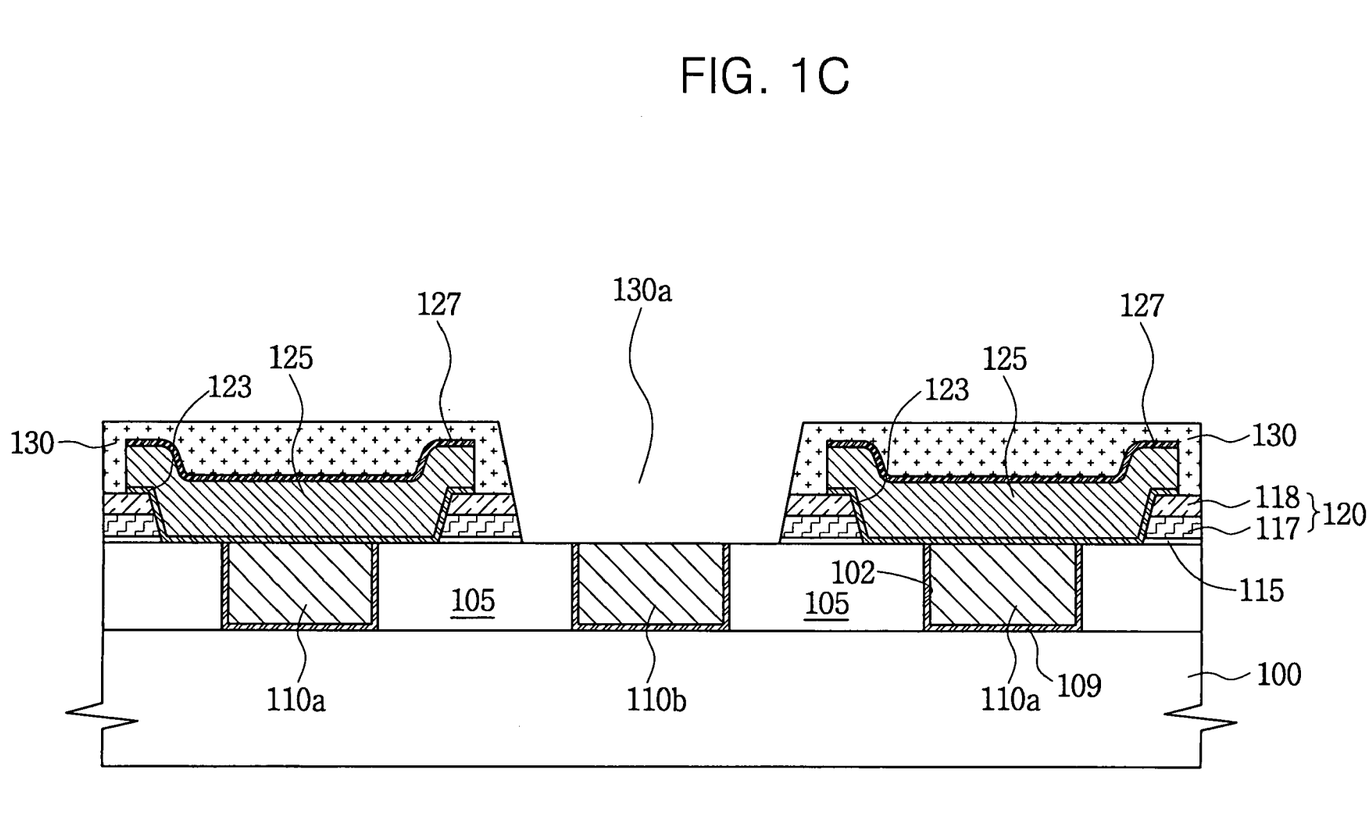
Figure 1D:
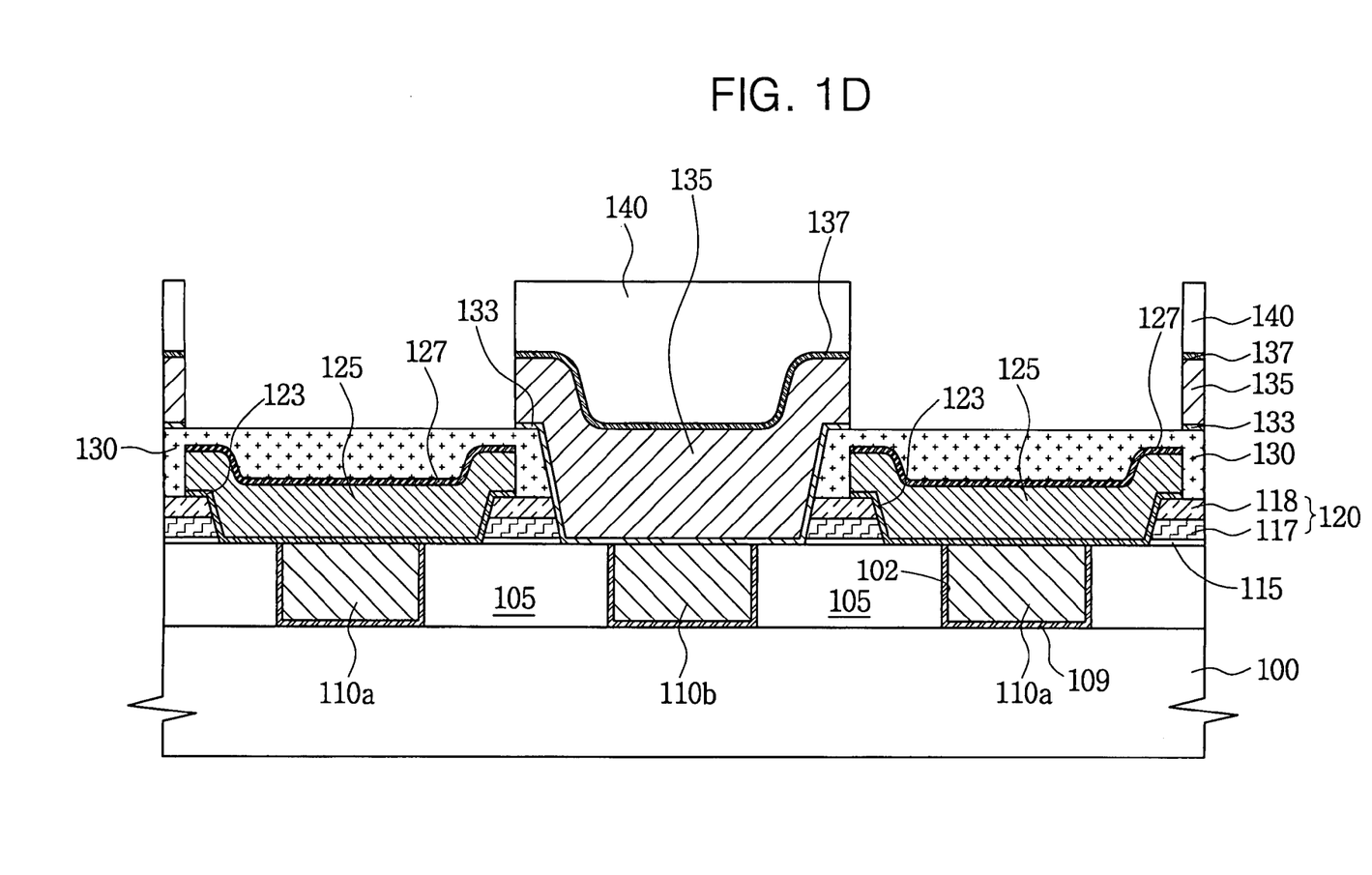

FIG. 1A through FIG. 1E are diagrams illustrating cross-sectional views of a method of fabricating an electronic device according to example embodiments. FIG. 2 is a diagram illustrating a cross-sectional view illustrating an electronic device according example embodiments.

A structure of the electronic device according to example embodiments will be described with reference to FIG. 1.

Figure 1E:
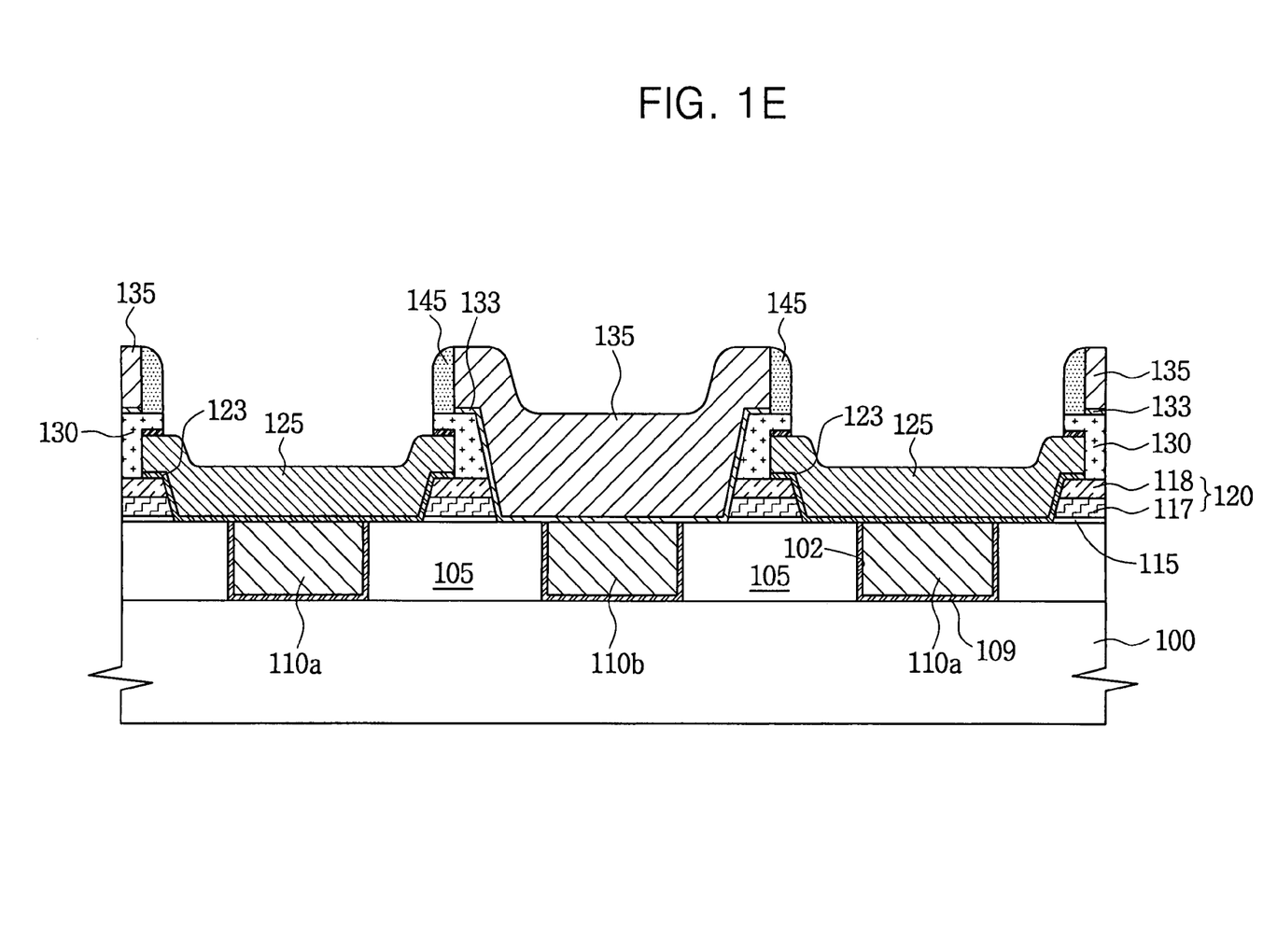
Figure 2:
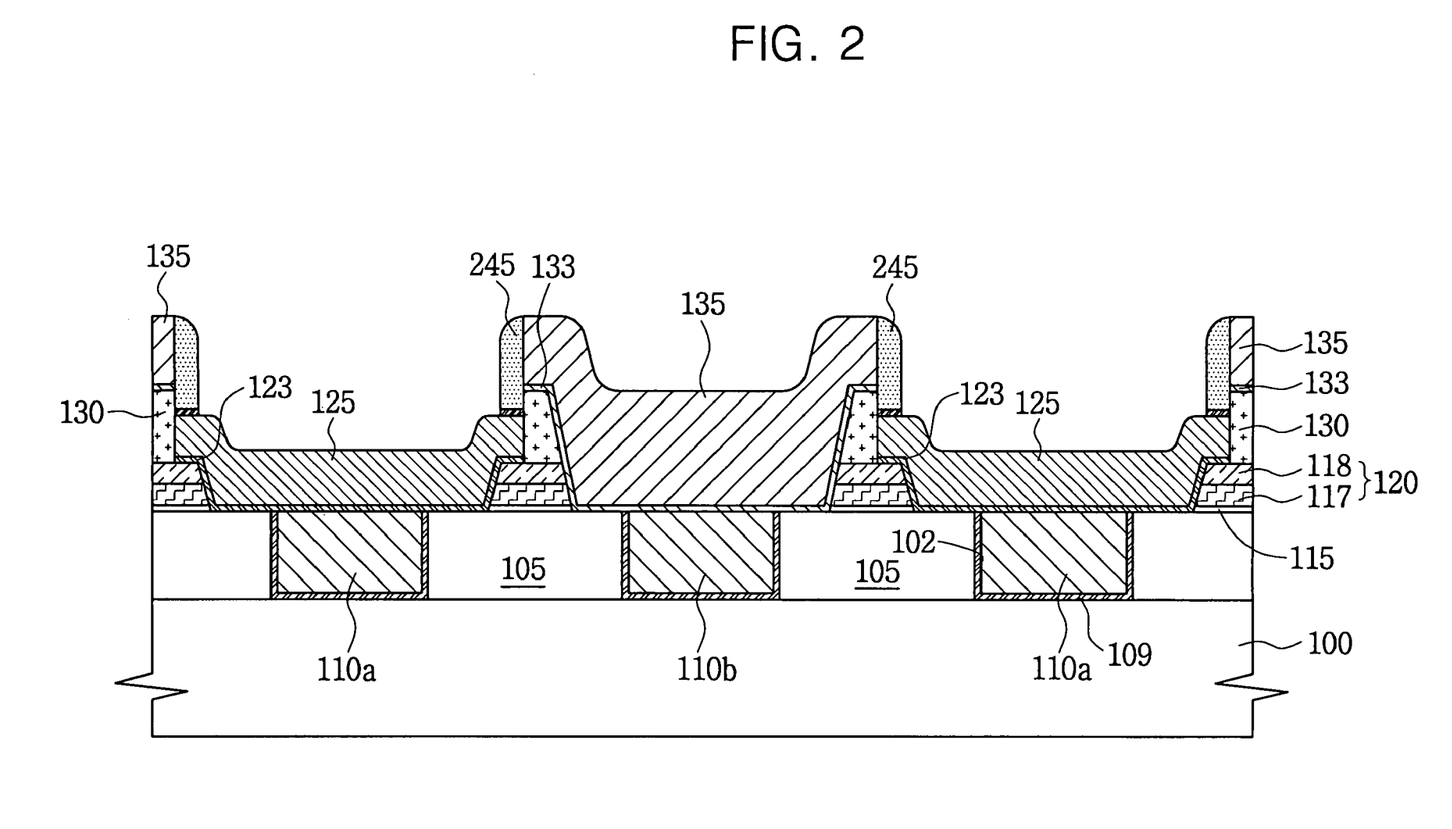
FIG. 2 is a diagram illustrating a cross-sectional view an electronic device according to example embodiments.

Referring to FIG. 1E, a substrate 100 is provided. The substrate 100 may be a semiconductor substrate having a conductive region. An interlayer insulating layer 105 may be formed on the substrate 100. The interlayer insulating layer 105 may include a silicon oxide layer. The interlayer insulating layer 105 may be formed of a low-k dielectric layer having a lower dielectric constant than that of the silicon oxide layer in order to increase the operating speed of a semiconductor device. For example, the low-k dielectric layer may include a fluorine-doped silicate glass layer (FSG), a hydrogen silsesquioxane layer (HSQ), a methyl silsesquioxane layer (MSQ or SiOC) or the like.

First and second metal patterns 110a and 110b may be formed passing through (or between) the interlayer insulating layer 105. The first and second metal patterns 110a and 110b may be in contact with a desired region of the substrate 100. The first and second metal patterns 110a and 110b may be a damascene interconnect structure. For example, the first and second metal patterns 110a and 110b may be copper (Cu) interconnects having the damascene interconnect structure.

The first metal patterns 110a and the second metal patterns 110b may be repeatedly arranged. One interconnection selected from among the second metal patterns 110b may be positioned between two first metal patterns 110a selected from among the first metal patterns 110a.

Interconnection barrier patterns 109 may be interposed between the first and second metal patterns 110a and 110b and the interlayer insulating layer 105. The interconnection barrier patterns 109 may include a metal nitride layer (e.g., a titanium nitride layer, a tantalum nitride layer or the like). If the first and second metal patterns 110a and 110b may include a copper layer, the interconnection barrier patterns 109 may prevent (or reduce the likelihood of) Cu elements in the first and second metal patterns 110a and 110b from diffusing into the substrate 100.

An insulating barrier layer 115 and a lower insulating layer 120 may be sequentially stacked on the substrate having the first and second metal patterns 110a and 110b. The insulating barrier layer 115 may be formed of a silicon nitride layer. The lower insulating layer 120 may include a first insulating layer 117 and a second insulating layer 118, sequentially stacked. The first insulating layer 117 may include a silicon oxide layer. The second insulating layer 118 may include a silicon oxide layer or a silicon nitride layer.

Referring to FIG. 1B, first bonding pads 125 may be formed sequentially passing through the lower insulating layer 120 and the insulating barrier layer 115 such that the first bonding pads 125 are electrically connected to the first metal patterns 110a. The first bonding pads 125 may have a higher top surface than the lower insulating layer 120. The first bonding pads 125 may be formed on (or covering) a portion of a top surface of the lower insulating layer 120. The first bonding pads 125 may be formed of an aluminum layer or an aluminum alloy layer. The aluminum alloy layer may include an aluminum (Al) element and/or a copper (Cu) element.

First barrier patterns 123 may be formed self-aligned with the first bonding pads 125. The first barrier patterns may be formed (or disposed) under the first bonding pads 125. The first barrier patterns 123 may include a metal nitride layer (e.g., a titanium nitride layer or a tantalum nitride layer).

Referring to FIG. 1C, an upper insulating layer 130 may be provided (or formed) on the lower insulating layer 120 around the first bonding pads 125. The upper insulating layer 130 may include a silicon oxide layer or a silicon nitride layer.

Second bonding pads 135 may be formed sequentially passing through the upper insulating layer 130, the lower insulating layer 120 and the insulating barrier layer 115. The second boding pads 135 may be electrically connected to the second metal patterns 110b. The second bonding pads 135 may have bottom surfaces which are positioned at the same level as the bottom surfaces of the first bonding pads 125. Each of the second bonding pads 135 may be positioned between the first bonding pads 125. Between the second bonding pads 135 and the first bonding pads 125 may be interposed the lower insulating layer 120 and the upper insulating layer 130. The second bonding pads 125 may be formed of the same material as that of the first bonding pads 125.

The second bonding pads 135 have a top surface which is positioned at a higher level than the first bonding pads 125. The second bonding pads 135 may be formed on (or covering) the portion of the top surface of the upper insulating layer 130. Each of the second bonding pads 135 may have a first region which is positioned at the same level as the first bonding pads 125 and a second region which is positioned at a higher level than the first bonding pads 125. The second region may have a greater width than the first region. The second region of the second bonding pads 135 may be positioned at a higher level than the first bonding pads 125. The second region of the second bonding pads 135 may be formed on (or covering) a portion of the top surface of the upper insulating layer 130.

From a plan view, the reduced distance between the second bonding pads 135 and the first bonding pads 125 may be seen. For example, as shown in FIG. 1E, the side wall of the first bonding pads 125 and the side wall of the second bonding pads 135 may be positioned (or formed) in a substantially vertical line. Although the side wall of the first bonding pads 125 and the side wall of the second bonding pads 135 are positioned in a substantially vertical line, an electric short between the first bonding pads 125 and the second bonding pads 135 may not occur because the upper insulating layer 130 is interposed between the first bonding pads 125 and the second bonding pads 135.

It can be seen from a top view that a two-dimensional area, which is occupied by the bonding pads may decrease because the distance between the first bonding pads 125 and the second bonding pads 135 may be reduced (or decreased) in an electronic device (e.g., a semiconductor chip). As such, the size of the electronic device may be reduced.

Referring to FIG. 1E, second barrier patterns 133 may be formed self-aligned to the second bonding pads 135. The second barrier patterns 133 may be positioned under the second bonding pads 135. The second barrier patterns 133 may include a metal nitride layer (e.g., a titanium nitride layer or a tantalum nitride layer).

Insulating spacers 145 may be provided on side walls of the second bonding pads 135. Insulating spacers 245 may be formed on (or covering) the side walls of the second bonding pads 135. The insulating spacers 245 may extend downward such that the insulating spacers 245 are formed on (or covering) a portion of the first bonding pads 125. The insulating spacers 145 and 245 may prevent (or reduce) an electric short between the first bonding pads 135 and the second bonding pads 125. The insulating spacers 145 and 245 may include a silicon oxide layer or a silicon nitride layer.

A method of fabricating an, electronic device according to example embodiments will be described below with reference to FIG. 1A through FIG. 1E.

Referring to FIG. 1A, a substrate 100 is prepared. The substrate 100 may by a semiconductor substrate including a conductive region. The substrate 100 may include one or more lower metal interconnection layers. An interlayer insulating layer 105 may be formed on the substrate 100. The interlayer insulating layer 105 may be formed of a silicon oxide layer. The interlayer insulating layer 105 may include a low-k dielectric layer having a lower dielectric constant than that of the silicon oxide layer in order to increase the operating speed of the semiconductor device. The low-k dielectric layer may be formed of a fluorine-doped silicate glass layer (FSG), a hydrogen silsesquioxane layer (HSQ), a methyl silsesquioxane layer (MSQ or SiOC) or the like.

Via holes and/or trenches 102 may be formed by patterning the interlayer insulating layer 105. Interconnection barrier patterns 109 may be formed on the inner walls of the via holes and/or the trenches 102. First and second metal patterns 110a and 110b, which fill the via holes and/or the trenches 102, may be formed on the interconnection barrier patterns 109. The first and second metal patterns 110a and 110b may be electrically connected to a desired region of the substrate 100. The first and second metal patterns 110a and 110b may be copper (Cu) interconnects. The interconnection barrier patterns 109 may include a metal nitride layer (e.g., a tantalum nitride layer or a titanium nitride layer). The interconnection barrier patterns 109 may prevent (or reduce the likelihood of) metal elements (e.g., Cu elements) in the first and second metal patterns 110a and 110b from diffusing into the substrate 100. The first metal patterns 110a and the second metal patterns 110b may be repeatedly arranged. One second metal interconnection 110b may be formed (or positioned) between two first metal patterns 110a selected from among the first metal patterns 110a.

An insulating barrier layer 115 and a lower insulating layer 120 may be sequentially formed on the substrate having the first and second metal patterns 110a and 110b. The insulating barrier layer 115 may be formed such that the insulating barrier layer 115 includes a silicon nitride layer. The lower insulating layer 120 may be formed of a first insulating layer 117 and a second insulating layer 118, sequentially stacked. The first insulating layer 117 may be formed including a silicon oxide layer or a silicon nitride layer. The second insulating layer 118 may be formed including a silicon oxide layer or a silicon nitride layer.

First pad holes 120a exposing the first metal patterns 110a may be formed by sequentially patterning the lower insulating layer 120 and the insulating barrier layer 115. As such, the sequentially stacked insulating barrier layer 115 and lower insulating layer 120 may be formed on (or covering) the second metal patterns 110b, which may be formed on (or positioned) between the first pad holes 120a.

Referring to FIG. 1B, a first barrier layer, a first pad layer and a first buffer layer may be sequentially formed on the substrate having the first pad holes 120a. The first barrier layer may include a metal nitride layer (e.g., a tantalum nitride layer or a titanium nitride layer). The first pad layer may be formed of an aluminum layer or an aluminum alloy layer. The aluminum alloy layer may include an Al element and/or a Cu element. The first buffer layer may be formed of a material which is different from that of the first pad layer. For example, the first buffer layer may be formed of a metal nitride layer.

First barrier patterns 123, first bonding pads 125 and first buffer patterns 127 may be sequentially formed on the first metal patterns 110a by patterning the first barrier layer, the first pad layer and the first buffer layer, sequentially stacked. The first buffer patterns 127 may prevent (or reduce) damage to the surface of the first bonding pads 125 during subsequent processes. The first buffer patterns 127 may prevent (or reduce) oxidation of the surface of the first bonding pads 125.

The first barrier patterns 123, the first bonding pads 125 and the first buffer patterns 127, which are sequentially stacked, may fill the first pad holes 120a. The first barrier patterns 123, the first bonding pads 125 and the first buffer patterns 127, which are sequentially stacked, may be formed partially covering a top surface of the lower insulating layer 120 around the first pad holes 120a. As such, the first barrier patterns 123, the first bonding pads 125 and the first buffer patterns 127, which are sequentially stacked, may be formed passing through the lower insulating layer 120 and the insulating barrier layer 115. The first barrier patterns 123, the first bonding pads 125 and the first buffer patterns 127 may be electrically connected to the first metal patterns 110a. The first barrier patterns 123, the first bonding pads 125 and the first buffer patterns 127 may have a top surface which is positioned at a higher level than the lower insulating layer 120. the first bonding pads 125 may have a region which is positioned at a higher level than the lower insulating layer 120.

Referring to FIG. 1C, an upper insulating layer 130 may be formed on the substrate having the first barrier patterns 123, the first bonding pads 125 and the first buffer patterns 127, sequentially stacked. The upper insulating layer may include a silicon oxide layer or a silicon nitride layer. Second pad holes 130a may be formed by patterning the upper insulating layer 130, the lower insulating layer 120 and the insulating barrier layer 115 to expose the second metal patterns 110b.

Referring to FIG. 1D, a second barrier layer, a second pad layer and a second buffer layer, which are sequentially stacked, may be formed on the substrate having the second pad holes 130a. The second barrier layer may include a metal nitride layer (e.g., a titanium nitride layer or a tantalum nitride layer). The second pad layer may be formed of an aluminum layer or an aluminum alloy layer. The aluminum alloy layer may include Al element and Cu element. The second buffer layer may be formed of the same material as that of the first buffer patterns 127. Mask patterns 140 may be formed on the second buffer layer. The mask patterns 140 may be formed of photoresist patterns.

Second barrier patterns 133, second bonding pads 135 and second buffer patterns 137, which are sequentially stacked, may be formed on the second metal patterns 110b by etching the second barrier layer, the second pad layer and the second buffer layer, which are sequentially stacked, using the mask patterns 140 as an etching mask.

The second barrier patterns 133, the second bonding pads 135 and the second buffer patterns 137, which are sequentially stacked, may fill the second pad holes 130a. The second barrier patterns 133, the second bonding pads 135 and the second buffer patterns 137, which are sequentially stacked, may be formed on (or partially covering) the top surface of the upper insulating layer 130 around the second pad holes 130a. As such, the second barrier patterns 133, the second bonding pads 135 and the second buffer patterns 137, which are sequentially stacked, may be formed passing through the upper insulating layer 130, the lower insulating layer 120 and the insulating barrier layer 115. The second barrier patterns 133, the second bonding pads 135 and the second buffer patterns 137 may be electrically connected to the second metal patterns 110b.

The second barrier patterns 133, the second bonding pads 135 and the second buffer patterns 137 may have a top surface which is positioned at a higher level than the upper insulating layer 130. The second bonding pads 135 may have a first region which is positioned at the same level as the first bonding pads 125 and a second region which is positioned at a higher level than the first bonding pads 135. The second region may have a greater width than that of the first region.

Referring to FIG. 1E, the mask patterns 140 may be removed. Insulating spacers 145 may be formed on the side walls of the second barrier patterns 133, the second bonding pads 135 and the second buffer patterns 137, sequentially stacked. The insulating spacers 145 may be formed of a material which has an etch selectivity with respect to the upper insulating layer 130. For example, if forming the upper insulating layer 130 with a silicon oxide layer, the insulating spacers 145 may be formed of a silicon nitride layer.

The upper insulating layer 130 may be etched using the insulating spacers 145 and the second buffer patterns 137 as an etching mask until the first buffer patterns 127 is exposed. While etching the upper insulating layer 130, the top surfaces of the first and second bonding pads 125 and 135 may be protected by the first and second buffer patterns (127 and 137 in FIG. 1D). The first bonding pads 125 and the second bonding pads 135 may be exposed by removing the first buffer patterns 127 and the second buffer patterns 137.

As shown in FIG. 2, the upper insulating layer 130 may be etched, after removing the mask patterns 140, using the second buffer patterns 137 as an etching mask until the first buffer patterns 127 is exposed. A spacer insulating layer may be formed on the substrate, which has the first buffer patterns 127, exposed by etching the upper insulating layer 130. Insulating spacers 245 may be formed by anisotropically etching the spacer insulating layer. The insulating spacers 245 may cover the side walls of the second bonding pads 135. The insulating spacers 245 may extend downward along the side walls.

It can be seen from the top view that a portion of the first bonding pads 135 may be covered with the insulating spacers 245 if the distance between the side walls of the second bonding pads 135 and the side walls of the first bonding pads 135 is equal or less than the thickness of the insulating spacers 245.

As described above, example embodiments provide a bonding pad structure which is capable of decreasing the distance between adjacent bonding pads, an electronic device having the bonding pad structure and a method of fabricating the electronic device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of fabricating an electronic device having a bonding pad structure, comprising:

forming a first bonding pad on a substrate;

forming a second bonding pad spaced apart from the first bonding pad, wherein a top surface of the second bonding pad is formed at a higher level than the first bonding pad, wherein the bonding pad structure includes at least two first bonding pads and at least two second bonding pads;

forming a lower insulating layer on the substrate, wherein the first bonding pads pass through the lower insulating layer;

forming an upper insulating layer on a portion of the substrate having the first bonding pads, wherein the second bonding pads sequentially pass through the upper insulating layer and the lower insulating layer; and exposing top surfaces of the first bonding pads by etching the upper insulating layer using the second bonding pads as etching masks.

2. The method according to claim 1, wherein the first bonding pads are formed covering a portion of a top surface of the lower insulating layer.

3. The method according to claim 1, wherein the second bonding pads are formed covering a portion of a top surface of the upper insulating layer.

4. The method according to claim 1, wherein the forming of the first bonding pads includes:

forming first pad holes passing through the lower insulating layer by patterning the lower insulating layer;

forming a first pad layer on a portion the substrate having the first pad holes; and patterning the first pad layer.

5. The method according to claim 4, further comprising:

forming a first buffer layer on the first pad, after forming the first pad layer;

forming first buffer patterns on the first bonding pads by patterning the first buffer layer while patterning the first pad layer;

etching the upper insulating layer using the second bonding pads as an etching mask; and removing the first buffer patterns.

6. The method according to claim 1, wherein forming the second bonding pads includes:

forming second pad holes passing though the upper insulating layer and the lower insulating layer by patterning the upper insulating layer and the lower insulating layer;

forming a second pad layer on the substrate with the second pad holes; and patterning the second pad layer.

7. The method according to claim 6, further comprising:

forming a second buffer layer on the second pad layer, after forming the second pad layer;

forming second buffer patterns on the second bonding pads by patterning the second buffer layer while patterning the second pad layer;

etching the upper insulating layer; and removing the second buffer patterns.

8. The method according to claim 1, further comprising:

forming a spacer insulating layer on a portion of the substrate having top surfaces of the first bonding pads exposed and the second bonding pads; and forming insulating spacers on side walls of the second bonding pads by anisotropically etching the spacer insulating layer.

9. The method according to claim 8, wherein the insulating spacers cover the side walls of the second bonding pads and a portion of the first bonding pads.

10. The method according to claim 1, further comprising:

forming insulating spacers on the side walls of the second bonding pads after forming the second bonding pads.

* * * * *